United States Patent
Bozkus et al.

(10) Patent No.: US 6,397,372 B1
(45) Date of Patent: *May 28, 2002

(54) CELL BASED PARALLEL VERIFICATION OF AN INTEGRATED CIRCUIT DESIGN

(76) Inventors: Zeki Bozkus, 13844 SW. 162$^{nd}$ Ter., Tigard, OR (US) 97223; Laurence W. Grodd, 3746 SE. Yamhill, Portland, OR (US) 97214

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/234,089
(22) Filed: Jan. 19, 1999
(51) Int. Cl.$^7$ ............................................. G06F 17/50
(52) U.S. Cl. ......................................................... 716/5
(58) Field of Search ..................... 715/2, 5, 8

(56) References Cited

U.S. PATENT DOCUMENTS 5,497,334 A * 3/1996 Russell ........................... 716/5
6,113,647 A * 5/2000 Silve ........................... 716/11

* cited by examiner

Primary Examiner—Matthew Smith
Assistant Examiner—Thuan Do
(74) Attorney, Agent, or Firm—Columbia IP Law Group, PC

(57) ABSTRACT

An EDA tool is provided with the ability to determine a cell based parallel verification order for a plurality of hierarchically organized design cells of an integrated circuit design, and the ability to verify the design cells in accordance with the cell based parallel verification order, with at least some of the design cells being verified in parallel. In one embodiment, the EDA tool is also provided with the ability to re-express a design cell of the IC design in terms of a number of newly formed intervening constituent design cells, with the new intervening constituent design cells being formed in accordance with a number of metrics profiling placements of original constituent design cells of the design cell.

37 Claims, 6 Drawing Sheets

CELL BASED PARALLEL VERIFICATION OF AN INTEGRATED CIRCUIT DESIGN

BACKGROUND OF THE INVENTION

1. Field of the Invention

The present invention relates to the field of integrated circuits (IC). More specifically, the present invention relates to methods and apparatuses associated with processing an IC design.

2. Background Information

Because of the ever increasing complexity of IC designs, most modern IC designs are expressed in terms of hierarchically organized design cells. For example, an exemplary IC may be expressed in terms of a collection of placements of design cells A, B, C, . . . and various "interconnecting" geometric elements, whereas design cell A may in turn be likewise expressed as a collection of placements of design cells Al, A2, . . . , and various "interconnecting" geometric elements within cell A, design cell B expressed as a collection of placements of design cells B1, B2, . . . , and various "interconnecting" geometric elements within cell B, and so forth.

Additionally, prior to fabrication (especially those IC designs fabricated using sub-micron processes), various verification operations, including but not limited to design rule checks (such as spacing), RC analysis, and so forth, are performed to ensure the fabricated IC will function as designed. In order to verify a particular design cell, in view of the hierarchical nature of its organization, it is necessary to verify the context independent and context dependent portions of the design cell separately. The context dependent portion of the design cell is promoted upward recursively until it is a part of the context independent portion of a higher level design cell. A process known as "selective promotion".

In order to facilitate efficient performance of these operations, various design cells injection techniques are employed to reduce the amount of selective promotions. Design cells injection is a process by which a design cell is re-expressed in terms of a number of artificially created design cells. For examples, a design cell A having placements of design cells A1, A2, A3, A4 and A5 may be re-expressed in terms of placements of artificially created design cells A10 and A11, where artificially created design cell A10 is comprised of placements of design cells A1 and A2, and artificially created design cell A11 is comprised of placements of design cells A3, A4 and A5. A particular "placement based" design cell injection technique is the subject of co-pending U.S. patent application Ser. No. 09/234,030, entitled "Placement Based Design Cell Injection Into An Integrated Circuit Design", filed contemporaneously. Three other prior art design cell injection techniques are also described in the background section of the '030 patent application.

However, even with reduced selective promotion and employing some of the most powerful workstations known today, it is not uncommon for many of today's IC designs taking a day or two to be verified. The situation is expected to get worse as the complexity of IC designs continues to increase. Thus, additional techniques to further speed up the verification process is desired.

SUMMARY OF THE INVENTION

An EDA tool is provided with the ability to determine a cell based parallel verification order for a plurality of hierarchically organized design cells of an integrated circuit design, and the ability to verify the design cells in accordance with the cell based parallel verification order, with at least some of the design cells being verified in parallel. In one embodiment, the EDA tool is also provided with the ability to re-express a design cell of the IC design in terms of a number of newly formed intervening constituent design cells, with the new intervening constituent design cells being formed in accordance with a number of metrics profiling placements of original constituent design cells of the design cell.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as row/column coordinates, cut lines, horizontal/vertical orientations, and so forth. As well understood by those skilled in the art, these terminology are merely logical in nature to facilitate explanation of the present invention. Parts of the description will also be presented in terms of operations performed by a computer system, using terms such as tables, data and the like. As well understood by those skilled in the art also, these quantities take the form of electrical, magnetic, or optical signals capable of being stored, transferred, combined, and otherwise manipulated through mechanical and electrical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily performed in the order they are presented, or order dependent. Lastly, repeated usage of the phrase "in one embodiment" does not necessarily refer to the same embodiment, although it may.

Figure 1:
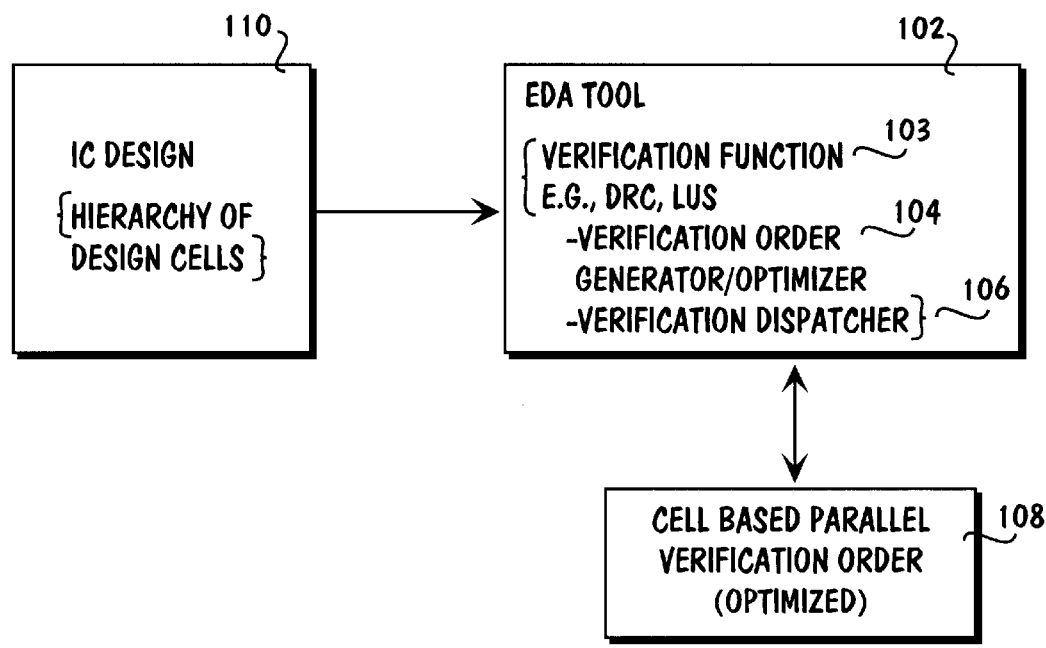
FIGS. 1–2 illustrate an overview of the cell based parallel verification of the present invention.
Figure 2:
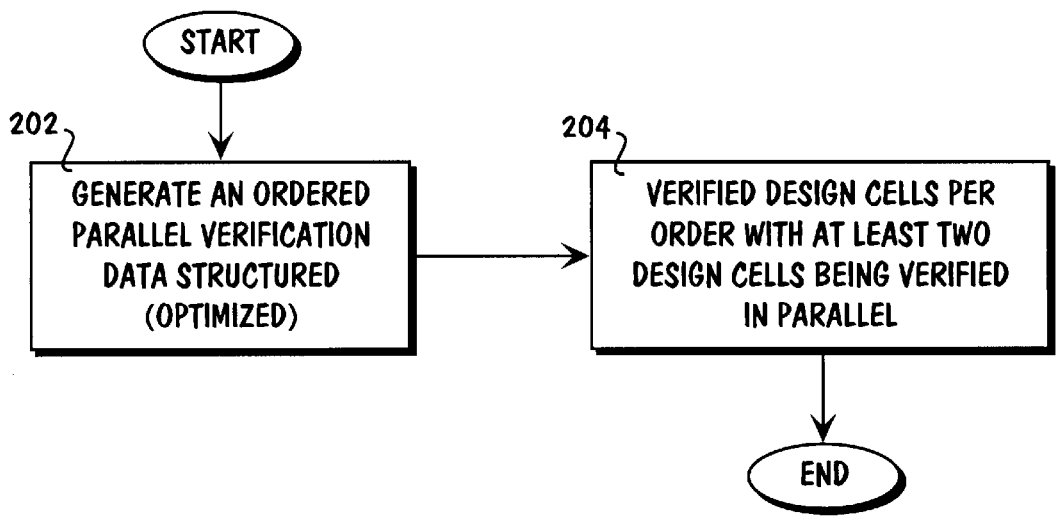

Referring now to FIGS. 1–2, wherein an overview of the cell based parallel verification of the present invention in accordance with one embodiment is shown. As illustrated, EDA tool 102, incorporated with the teachings of the present invention, includes in particular, a number of verification functions 103, verification order generator/optimizer 104 and verification dispatcher 106. In accordance with the present invention, verification functions 103 perform conventional verification functions such as DRC and LVS. Verification order generator/optimizer 104 determines cell based parallel verification order 108 for a number hierarchically organized design cells of integrated circuit design 110, and verification dispatcher 106 dispatches the design cells for verification in parallel in accordance with cell based parallel verification order 108. Except for verification order generator/optimizer 104, verification dispatcher 106, and the manner verification functions 103 cooperate with dispatcher 106, which are described in further details below, EDA tool 102 is otherwise intended to represent a broad range of EDA tools known in the art, including in particular those tools having verification functions for performing design rule checks (DRC) and layout versus schematic (LVS).

As shown in FIG. 2, operationally, at 202, verification order generator/optimizer 104 determines cell based parallel verification order 108 for the hierarchically organized design cells of integrated circuit design 110. Preferably, cell based parallel verification order 108 is optimized with improved overall order distance separation between parent and child design cells. Order distance separation refers to the positional difference between the verification positions occupied by the parent and child design cells. In general, the larger the order distance separating the parent and child design cells, the greater the probability verification of the child design cell will be completed at the time when resource is available for use to verify the parent design cell. Thus, improved overall order distance separation between parent and child design cells results in reduction of the overall "waiting time" of the parent design cells.

At 204, verification dispatcher 106 dispatches the design cells for verification in parallel in accordance with generated cell based parallel verification order 108. As will be described in more detail below, in one embodiment, verification dispatcher 106 dispatches design cells for verification in parallel, in cooperation with verification functions 103. In an alternate embodiment, verification dispatcher 106 independently dispatches as many design cells without child design cell dependency for verification as possible, i.e. as many as resource of the underlying computer system on which the present invention is practiced will support.

Figure 3:
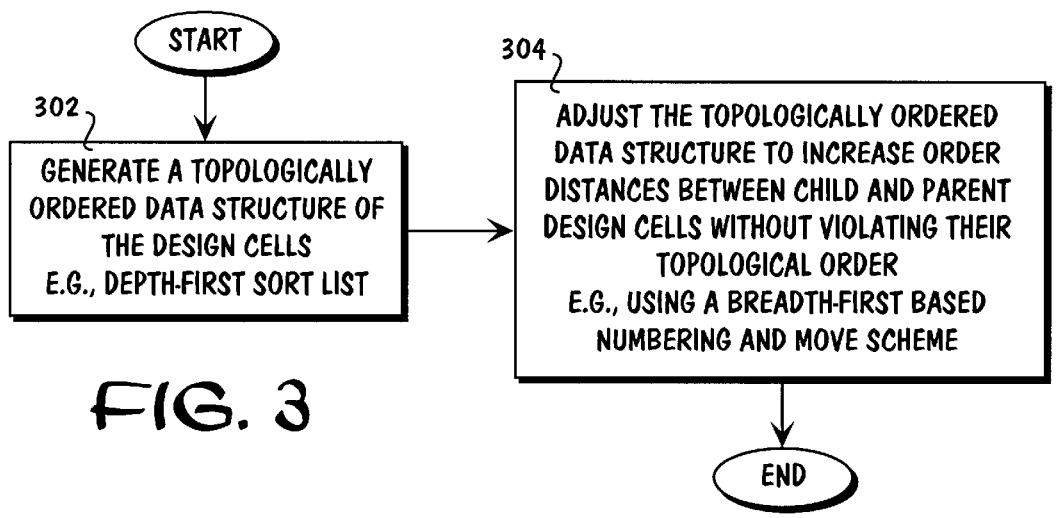
FIG. 3 illustrates the operational flow for generating an optimized cell based parallel verification order in accordance with one embodiment.

FIG. 3 illustrates the operational flow for generating an optimized cell based verification order in accordance with one embodiment. As shown, at 302, verification order generator/optimizer 104 first generates a cell based topologically ordered data structure of the design cells of IC design 110. A particular example of a cell based topologically ordered data structure is a cell based depth-first sort list. Other topologically ordered data structure may also be employed. Next, at 304, verification order generator/optimizer 104 adjusts the cell based topologically ordered data structure to increase the order distances between child and parent design cells, without violating their topological order.

In one embodiment where the depth-first sort list is employed as the topologically ordered data structure, to effectuate the optimization adjustment, verification order generator/optimizer 104 first numbers the design cells in the depthfirst sort list in accordance with the design cells' positions in an alternate breadth-first sort list, e.g. 1, 2, 3. . . . from left to right, top to bottom. Then, starting from the earliest verification position (also referred to as the "bottom position" of the list), scanning in a later verification direction towards the later verification positions, verification order generator/optimizer 104 examines each design cell and determines if the design cell can be moved to a later verification position. (The latest verification position is also referred to as the "top position" of the list.)

In one embodiment, the move (or relocation) determination is made employing two heuristic rules. The first of these two heuristic rules is the rule that no design cell will be moved pass a design cell having a "breadth-first" number that denotes "earlier in position" then the "breadth-first" number of the design cell whose "relocation" is being contemplated, e.g. a design cell numbered 7 in accordance with the above described left to right, top to bottom manner, will not be moved pass a design cell numbered "6". The second of these two heuristic rules is the rule that no design cell will be moved pass its parent design cell. (Note that as described earlier, all contemplated movements are in the later verification direction, i.e. towards the "top position" of the list.

In alternate embodiments, one or more other optimization techniques are employed either in lieu of or in addition to the above described depth-first and breadth-first approach to further enhancing the verification distance between the parent and child design cells. In one embodiment, these one or more other optimization techniques include reordering child design cells of the same generation in accordance with their content volumes. That is, a child design cell with more contents is given an earlier verification position than a child design cell of the same generation with less contents.

Figure 4A:
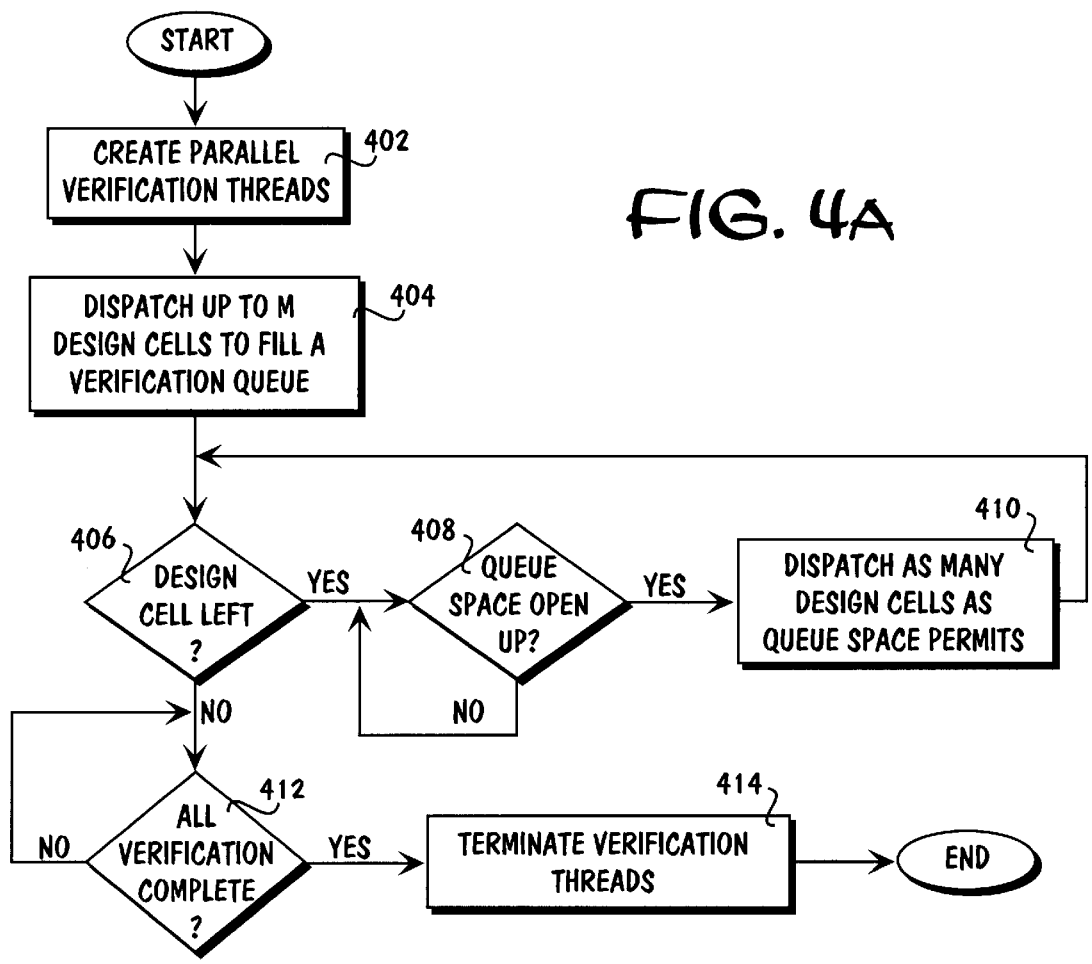
FIGS. 4a–4c illustrate the operational flow for verifying multiple design cells in parallel in accordance with two embodiments.
Figure 4B:
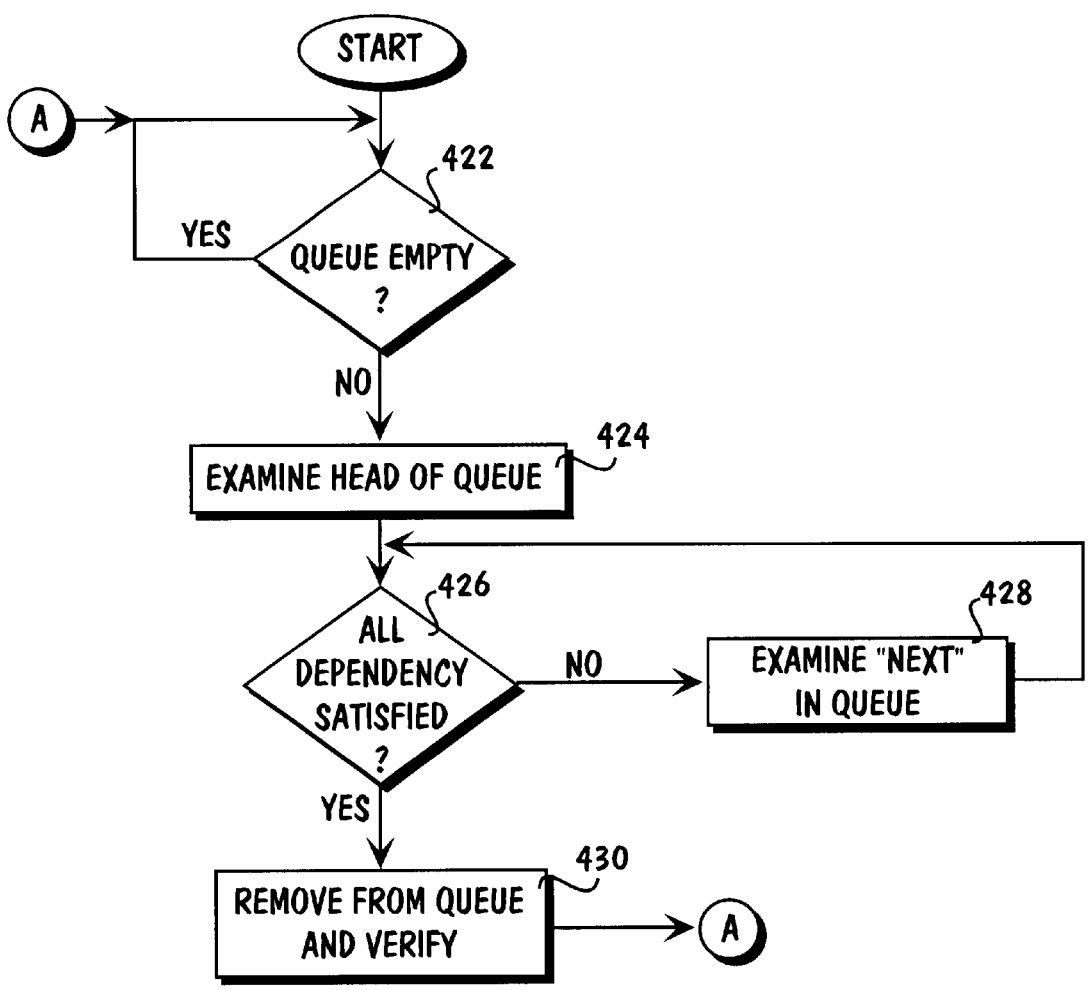
Figure 4C:
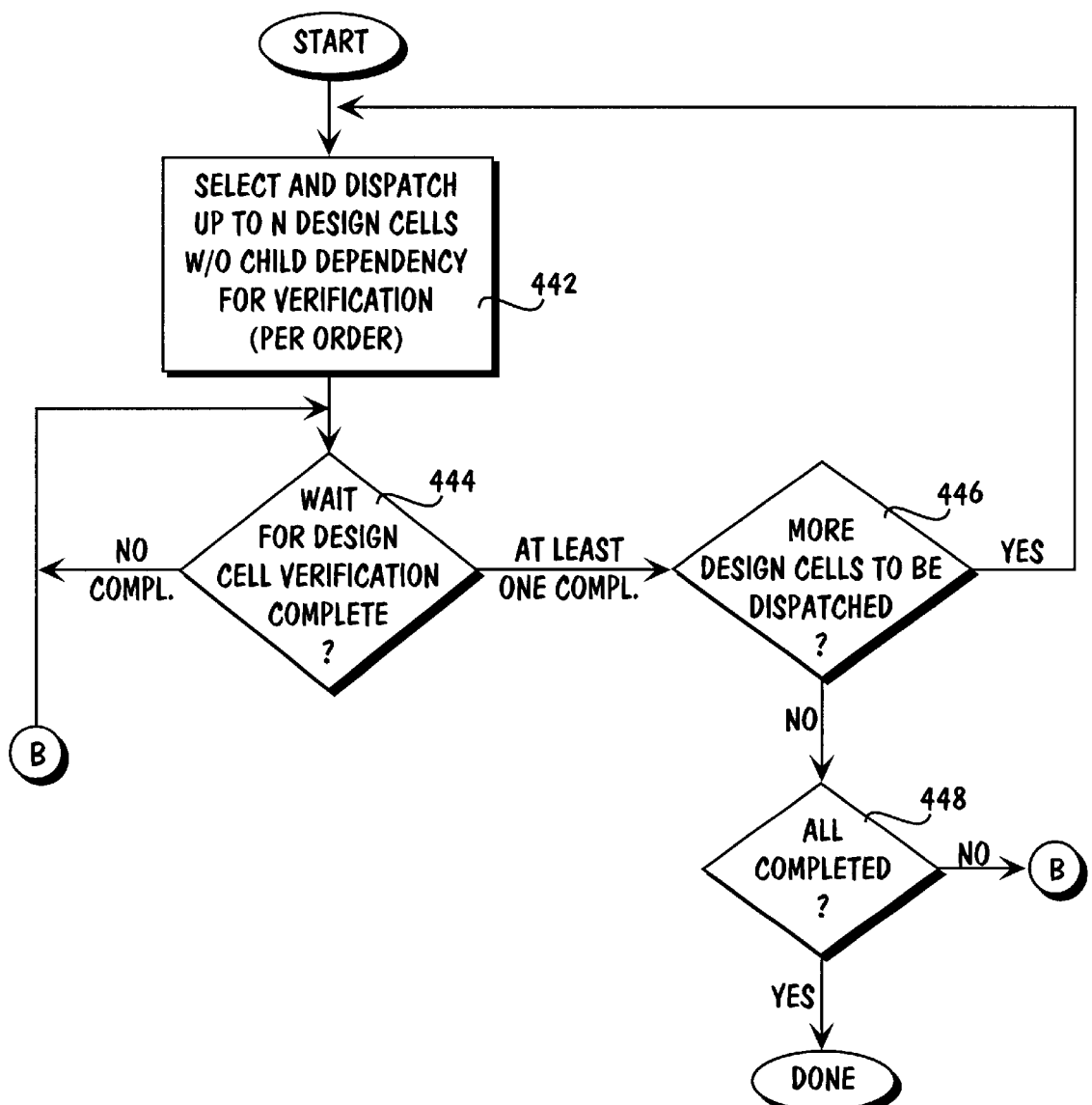

FIGS. 4a–4c illustrates the operational flow of dispatching multiple design cells for verification in parallel in accordance with one embodiment, where the desired parallelism is cooperatively accomplished by dipsatcher 106 and verification functions 103. As shown in FIG. 4a, at 402, dispatcher 106 creates n parallel verification threads of the desired verification function, where n typically is as large as the resources of the underlying computer system on which the present invention is practiced will support. For example, in an 8-way symmetric multiprocessor systems, where all 8 processors are available, dispatcher 106 creates 8 verification threads, one on each of the processor. For illustrative purpose, in the case of a Windows NT® system, each verification thread is created using "Create Thread", whereas in the case of a UNIX® system, each verification thread is created using "pthread_create". Windows NT is available from Microsoft, Inc. of Redmond, Wash., whereas UNIX is available from Sun Microsystems, Inc. of Mountain View, Calif. (marketed as Solaris).

Next, at 404, dispatcher 106 dispatches up to m design cells to fill a verification queue, where m is the smaller of the verification queue or the number of design cells requiring verification. Dispatcher 106 selects the m design cells starting from the earliest verification position, moving towards the latest verification position, in accordance with the verification order generated. If there are still residual design cells to be dispatched after dispatching the first m design cells, at 408, dispatcher 106 waits for the queue space to "open up". The queue space "opens up", when design cells are dequeued from the verification queue by verification functions 103. Upon detecting the availability of queue space, at 410, dispatcher 106 dispatches additional design cells to fill up the empty queue space, and continues its execution at 406.

Eventually, dispatcher 106 will determine at 406 that all design cells have been dispatched. At such time, dispatcher 106 waits for all remaining verifications to complete, 412. When all remaining verifications are completed, 414, dispatcher 106 terminates the verification threads it created.

FIG. 4b illustrates the operational flow of a verification thread of verification functions 103. As shown, at 422, the verification thread checks to determine if the verification queue is empty, and waits for the verification queue to become non-empty. Upon detecting that dispatcher 106 has dispatched design cells into the verification queue for verification, 424, the verification thread first examines the design cell placed at the head of the verification queue to determine if all dependency has been satisfied, i.e. the verification has been completed for all its child design cells. If not all dependency has been determined to be satisified, the verification thread examines the next design cell in the verification queue, 428. The process continues until the verification thread finds a design cell having all dependency satisfied. At such time, the verification thread removes the design cell from the verification queue and verifies the design cell, 430. In one embodiment, if the verification thread is unable to find a design cell with all dependency satisfied, it repeats the process starting at the head of the verification queue or wait until new cells come to the verification queue. The process continues with multiple repeats if necessary until the verification thread finds a design cell with all dependency satisfied.

FIG. 4c illustrates the operational flow of dispatcher 106 independently dispatching multiple design cells for verification in parallel in accordance with an alternate embodiment. As illustrated, at 442, verification dispatcher 106 first selects up to n design cells occupying the earliest verification positions and without child design cell dependency, and dispatches them for verification in parallel. In one embodiment, verification dispatcher 106 scans the cell based parallel verification order 108, starting from the earliest verification position, and determines for each design cell whether it is child design cell dependency free and if so, whether the resource of the underlying computer system can support its verification. If either the design cell is not child design cell dependency free or the resource of the underlying computer system is unable to support verification of the design cell, verification dispatcher 106 temporarily halts the "scanning". In one embodiment, each design cell is dispatched for verification as an execution "thread".

Upon having dispatched up to n design cells without child design cell dependency, verification dispatcher 106 waits for completion of at least one of the dispatched verifications at 444. Whenever verification of one of the previously dispatched design cell is completed, at 446, verification dispatcher 106 determines if there are additional design cells to be dispatched. If there are additional design cells to be dispatched, verification dispatcher 106 returns to 442 and dispatches as many design cells without child design cell dependency as the resource of the underlying computer system will support, as described earlier. On the other hand, if all design cells have been dispatched, at 448, verification dispatcher 106 determines if verifications of all previously dispatched design cells have been completed. If not all verifications of previously dispatched design cells have been completed, verification dispatcher 106 returns to 444 to wait for their completion. On the other hand, if verifications of all previously dispatched design cells have been completed, verification dispatcher 106 terminates the process.

The later approach enables the parallel dispatching to be accomplished through dispatcher 106 only, and therefore without requiring any modifications to conventional verification functions 103. However, the approach will require more thread creations and terminations. The earlier approach minimizes the number of thread creations and terminations. However, it requires small amount of coordinated enhacements to the otherwise conventional verification functions.

Experience has shown that the above described cell based parallel verification is superior to other types of parallel verification. For example, experience has shown that if parallel verification is attempted at the layer level, while it is a good source of parallelism, as there is little dependency between layers, the approach nevertheless has the disadvantage of requiring changes to a number of the common hierarchical data structures, such as the cell list, placement list, temporary layer usage, and so forth. Each of these data structures will have to be replicated for each layer to facilitate parallel layer verifications, resulting in significant increase in memory and storage usage. Similarly, parallelism may also be attempted at the scanline level. However, scanline level parallelism has the disadvantage of requiring changes to a number of the verification algorithms. In contrast, the above described cell based parallel approach does not have any of these disadvantages. In fact, experience has shown that the above described cell based approach is much superior in scalability than either the layer or the scanline approach.

Figure 5:
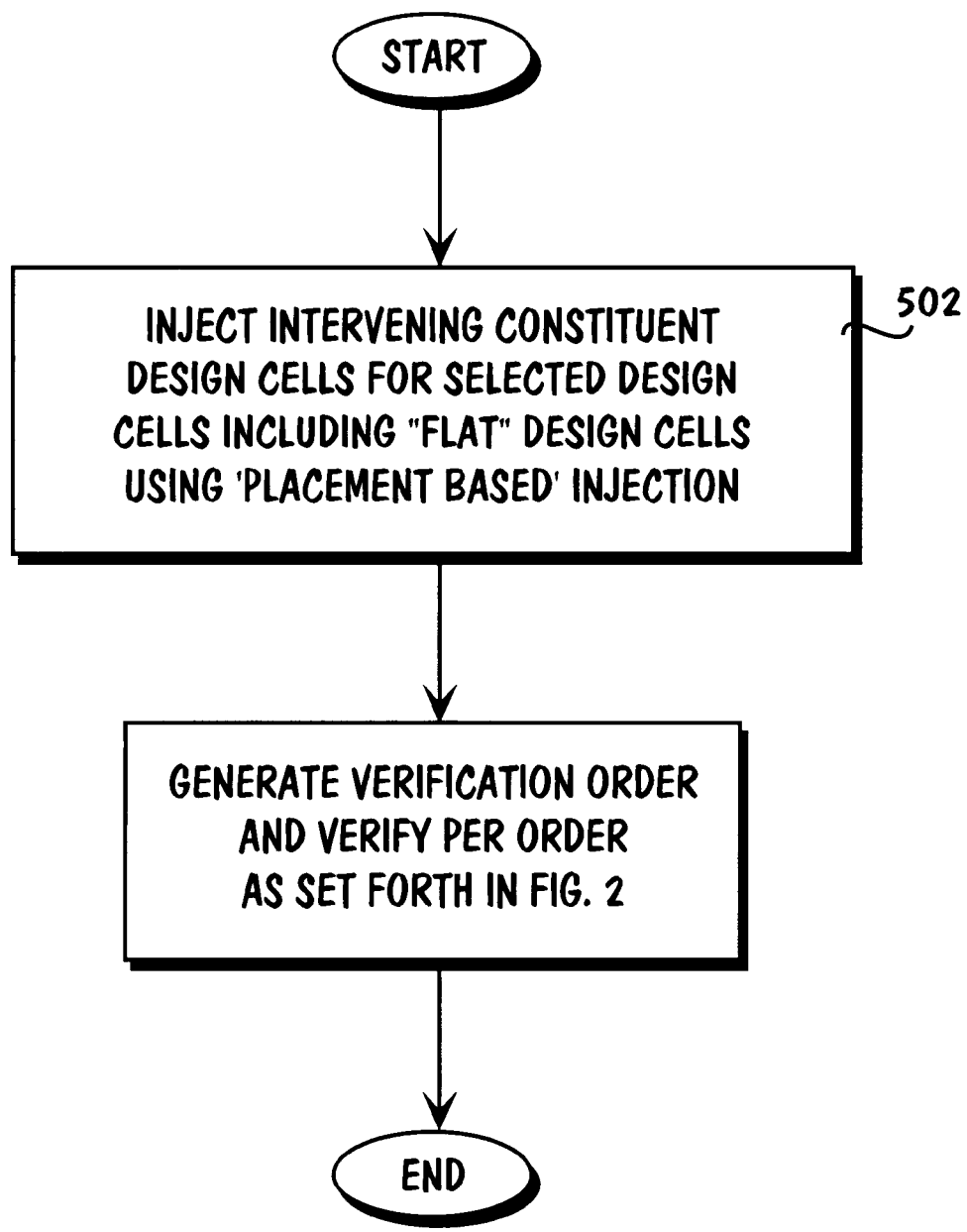
FIG. 5 illustrates a sample application of the present invention.

FIG. 5 illustrates a sample application of the present invention. For the illustrated application, EDA tool 102 is also incorporated with the teachings of the above identified U.S. patent application Ser. No. 09/234,030, filed contemporaneously, for placement based design cell injections into an integrated circuit design. The '030 application is hereby fully incorporated by reference. In any event, at 502, EDA tool 102 systematically processes the design cells of IC design 110, and injects intervening constituent design cells where appropriate. In particular, for "flat" design cells, EDA tool 102 employs metrics to profile placements of constituent design cells of a particular design cell, and then uses the metrics to selectively group contents of the design cells to form new intervening constituent design cells to re-express the various "flat" design cells. As discussed in the incorporated by reference, contemporaneously filed co-pending application, the placement based design cell injection technique enables intervening constituent design cells to be injected even though the particular design cells' constituent deign cells do not exhibit any particular inter-cell relationship suitable for the application of either the homogeneous, overlapping or heterogeneous technique.

Upon injecting the intervening constituent design cells, including those injected employing the placement based technique, at 504, the EDA tool proceeds to generate a cell based parallel verification order, and to verify the design cells in parallel, wherever possible, in accordance with the generated cell based verification order, as described earlier, referencing FIGS. 2–4.

Figure 6:
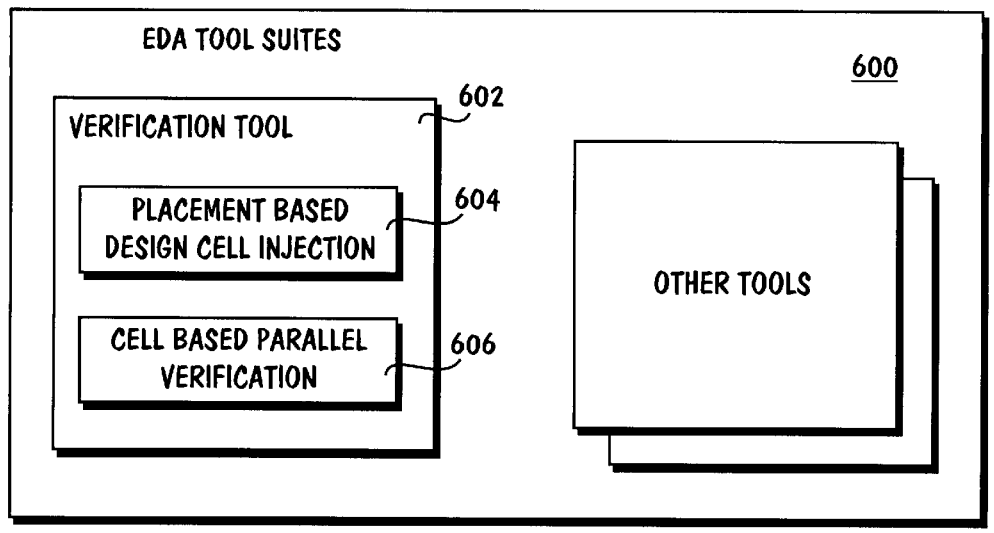
FIG. 6 illustrates an EDA tool suite incorporated with the teachings of the present invention in accordance with one embodiment.

Referring now to FIG. 6, wherein an EDA tool suite incorporated with the teaching of the present invention is shown. As illustrated, EDA tool 600 includes a number of tools, in particular, verification tool 602. For the illustrated embodiment, verification tool 602 is incorporated with the teachings of the present invention, i.e. cell based parallel verification of an IC design, 604, as well as the teachings of the co-pending application, i.e. placement based design cells injection, 606.

Figure 7:
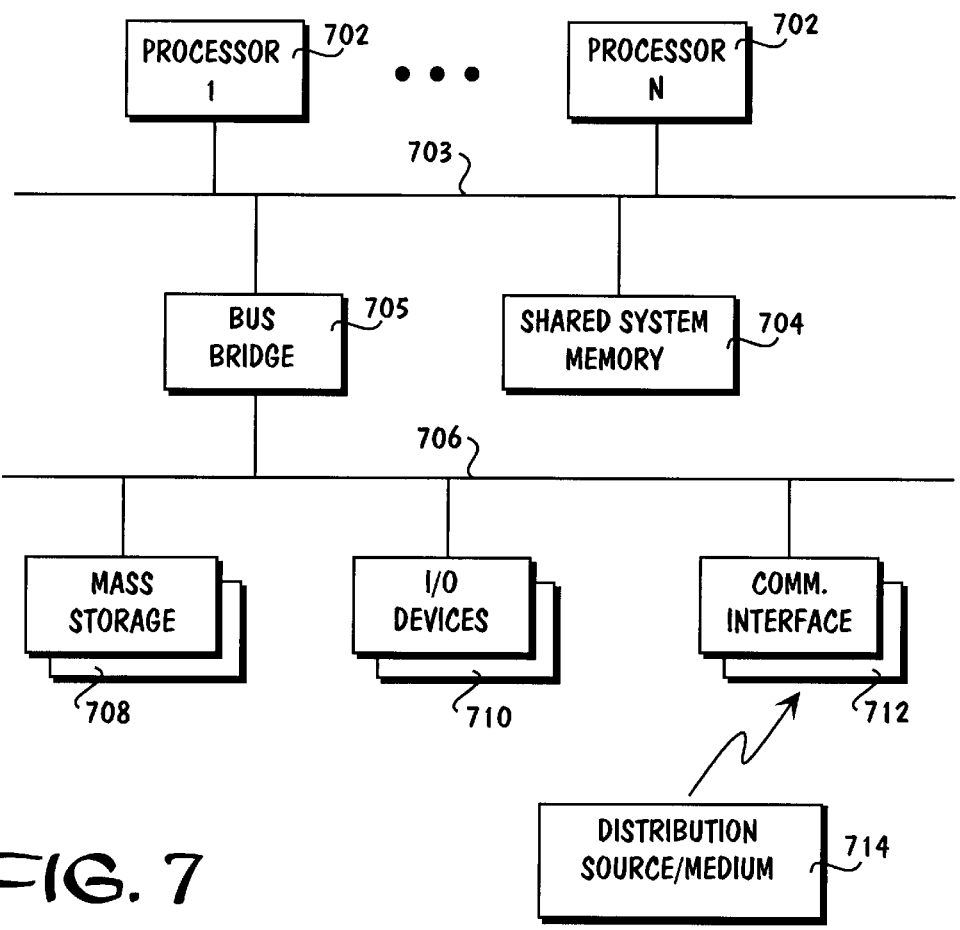
FIG. 7 illustrates a computer system suitable for practicing the present invention.

FIG. 7 illustrates one embodiment of a computer system suitable for use to practice the present invention. As shown, computer system 700 includes a number of processors 702 and shared system memory 704 coupled to each other via processor bus 703. Computer system 700 also includes system bus 706, bridged to processor bus 703 by bus bridge 705. Coupled to system bus 706 are non-volatile mass storage 708, input/output devices 710, such as keyboard, displays, and so forth, and communication interfaces 712, such as modem, LAN interfaces, and so forth. Each of these elements perform its conventional functions known in the art. In particular, shared system memory 704 and non-volatile mass storage 708 are employed to store a working copy and a permanent copy of the programming instructions implementing the above described teachings of the present invention. Shared system memory 704 and non-volatile mass storage 706 may also be employed to store the IC design. The permanent copy of the programming instructions to practice the present invention may be loaded into nonvolatile mass storage 708 in the factory, or in the field, through distribution source/medium 714 and communication interfaces 712. Examples of distribution medium 714 include recordable medium such as tapes, CDROM, DVD, and so forth. In one embodiment, the programming instructions are part of a collection of programming instructions implementing EDA tool 600 of FIG. 6. The constitution of elements 702–714 are well known, and accordingly will not be further described.

Thus, a method and apparatus for cell based parallel verification of an IC design has been described. While the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. A method comprising:

receiving a hierarchical organization for a plurality of design cells comprising an integrated circuit design, said hierarchical organization defining at least two layers of design cells, a higher layer in the hierarchical organization corresponding to parent design cells, said parent design cells having data dependencies on respective child design cells corresponding to one or more lower layers in the hierarchical organization; and reordering the hierarchical organization into a verification order to increase distances between positions in the verification order corresponding to the child design cells and positions in the verification order corresponding to the respective parent design cells.

2. The method of claim 1 wherein reordering the hierarchical organization comprises:

generating a topological order to define topological relationships between sets of child/parent design cells;

generating a sequential order for the plurality of design cells wherein all design cells from each layer of the hierarchical organization are sequentially listed in the sequential order; and switching positions among design cells in the sequential order to increase the distances in the verification order without violating the topological relationships.

3. The method of claim 2 wherein the topological order comprises a depth-first sort list which numbers design cells based on layer positions in the hierarchical organization.

4. The method of claim 2 wherein the sequential order comprises a breadth-first sort list which sequentially numbers the plurality of design cells starting with a first cell in a first layer and ending with a last cell in a last layer.

5. The method of claim 2 wherein switching positions without violating the topological relationships comprises:

locating a position corresponding to a first parent design cell; and moving the position corresponding to the first parent design cell to a later verification position without passing a position corresponding to a parent design cell of the first parent design cell.

6. The method of claim 2 wherein switching positions without violating the topological relationships comprises:

locating a position corresponding to a first parent design cell; and moving the position corresponding to the first parent design cell to a later verification position without passing a position corresponding to a higher order topological layer.

7. The method of claim 1 wherein the distances in the verification order between the positions corresponding to the child design cells and the positions corresponding to the respective parent design cells provide a lower probability of data dependencies between subsequently ordered design cells compared to the hierarchical organization.

8. The method of claim 1 further comprising:

providing the plurality of design cells for verification according to the verification order, multiple design cells having no data dependencies to be verified in parallel.

9. The method of claim 8 wherein providing the plurality of design cells comprises:

dispatching a first m design cells in the verification order to a verification queue, n design cells that have no data dependencies to be selected, verified, and dequeued from the queue in parallel; and iteratively dispatching a next m-n design cells in the verification order as design cells are selected, verified, and dequeued until a last design cells has been dispatched.

10. The method of claim 8 wherein providing the plurality of design cells comprises:

examining the plurality of design cells in the verification order for data dependencies;

dispatching for verification a first design cell determined to have no data dependencies;

removing the dispatched design cell from further examination; and repeatedly examining remaining ones of the plurality of design cells in the verification order for data dependencies, dispatching for verification a first design cell among the remain ones to have no data dependencies, and removing the dispatched design cells until a last design cell is dispatched.

11. The method of claim 8 herein providing the plurality of design cells comprises:

selecting up to n design cells having no data dependencies in the verification order;

dispatching the up to n design cells;

waiting for the up to n design cells to be verified in parallel; and repeatedly selecting, dispatching, and waiting until a last design cell is dispatched.

12. The method of claim 1 further comprises:
injecting a number of new intervening constituent design cells to re-express a design cell in terms of the newly injected intervening constituent design cells before reordering the hierarchical organization.

13. The method of claim 12, wherein injecting the new intervening constituent design cells comprises a selected one of a number of pattern based recognition techniques and a placement based technique.

14. The method of claim 13, wherein the placement based technique comprises:
determining a number of metrics to profile placements of constituent design cells of the design cell; and
generating the new intervening constituent design cells using the determined metrics.

15. A machine readable medium having stored thereon machine executable instructions to implement a method comprising:
receiving a hierarchical organization for a plurality of design cells comprising an integrated circuit design, said hierarchical organization defining at least two layers of design cells, a higher layer in the hierarchical organization corresponding to parent design cells, said parent design cells having data dependencies on respective child design cells corresponding to one or more lower layers in the hierarchical organization; and
reordering the hierarchical organization into a verification order to increase distances between positions in the verification order corresponding to the child design cells and positions in the verification order corresponding to the respective parent design cells.

16. The machine readable medium of claim 15 wherein reordering the hierarchical organization comprises:
generating a topological order to define topological relationships between sets of child/parent design cells;
generating a sequential order for the plurality of design cells wherein all design cells from each layer of the hierarchical organization are sequentially listed in the sequential order; and
switching positions among design cells in the sequential order to increase the distances in the verification order without violating the topological relationships.

17. The machine readable medium of claim 16 wherein the topological order comprises a depth-first sort list which numbers design cells based on layer positions in the hierarchical organization.

18. The machine readable medium of claim 16 wherein the sequential order comprises a breadth-first sort list which sequentially numbers the plurality of design cells starting with a first cell in a first layer and ending with a last cell in a last layer.

19. The machine readable medium of claim 16 wherein switching positions without violating the topological relationships comprises:
locating a position corresponding to a first parent design cell; and
moving the position corresponding to the first parent design cell to a later verification position without passing a position corresponding to a parent design cell of the first parent design cell.

20. The machine readable medium of claim 16 wherein switching positions without violating the topological relationships comprises:
locating a position corresponding to a first parent design cell; and
moving the position corresponding to the first parent design cell to a later verification position without passing a position corresponding to a higher order topological layer.

21. The machine readable medium of claim 15 wherein the distances in the verification order between the positions corresponding to the child design cells and the positions corresponding to the respective parent design cells provide a lower probability of data dependencies between subsequently ordered design cells compared to the hierarchical organization.

22. The machine readable medium of claim 15 further comprising:
providing the plurality of design cells for verification according to the verification order, multiple design cells having no data dependencies to be verified in parallel.

23. The machine readable medium of claim 22 wherein providing the plurality of design cells comprises:
dispatching a first m design cells in the verification order to a verification queue, n design cells that have no data dependencies to be selected, verified, and dequeued from the queue in parallel; and
iteratively dispatching a next m-n design cells in the verification order as design cells are selected, verified, and dequeued until a last design cells has been dispatched.

24. The machine readable medium of claim 22 wherein providing the plurality of design cells comprises:
examining the plurality of design cells in the verification order for data dependencies;
dispatching for verification a first design cell determined to have no data dependencies;
removing the dispatched design cell from further examination; and
repeatedly examining remaining ones of the plurality of design cells in the verification order for data dependencies, dispatching for verification a first design cell among the remain ones to have no data dependencies, and removing the dispatched design cells until a last design cell is dispatched.

25. The machine readable medium of claim 22 wherein providing the plurality of design cells comprises:
selecting up to n design cells having no data dependencies in the verification order;
dispatching the up to n design cells;
waiting for the up to n design cells to be verified in parallel; and
repeatedly selecting, dispatching, and waiting until a last design cell is dispatched.

26. The machine readable medium of claim 15 further comprises:
injecting a number of new intervening constituent design cells to re-express a design cell in terms of the newly injected intervening constituent design cells before reordering the hierarchical organization.

27. The machine readable medium of claim 26, wherein injecting the new intervening constituent design cells comprises a selected one of a number of pattern based recognition techniques and a placement based technique.

28. The machine readable medium of claim 27, wherein the placement based technique comprises:
determining a number of metrics to profile placements of constituent design cells of the design cell; and
generating the new intervening constituent design cells using the determined metrics.

29. A computer system comprising:
- a computer readable storage medium to store computer executable instructions; and
- one or more processors coupled to the computer readable medium to execute the instructions, executing said instructions to cause the processors to
- receive a hierarchical organization for a plurality of design cells comprising an integrated circuit design, said hierarchical organization defining at least two layers of design cells, a higher layer in the hierarchical organization corresponding to parent design cells, said parent design cells having data dependencies on respective child design cells corresponding to one or more lower layers in the hierarchical organization; and
- reorder the hierarchical organization into a verification order to increase distances between positions in the verification order corresponding to the child design cells and positions in the verification order corresponding to the respective parent design cells.

30. The computer system of claim 29 wherein to reorder the hierarchical organization, the processor are to:
- generate a topological order to define topological relationships between sets of child/parent design cells;
- generate a sequential order for the plurality of design cells wherein all design cells from each layer of the hierarchical organization are sequentially listed in the sequential order; and
- switch positions among design cells in the sequential order to increase the distances in the verification order without violating the topological relationships.

31. The computer system of claim 30 wherein to switch positions without violating the topological relationships, the processors are to:
- locate a position corresponding to a first parent design cell; and
- move the position corresponding to the first parent design cell to a later verification position without passing a position corresponding to a parent design cell of the first parent design cell.

32. The computer system of claim 30 wherein to switch positions without violating the topological relationships, the processors are to:
- locate a position corresponding to a first parent design cell; and
- move the position corresponding to the first parent design cell to a later verification position without passing a position corresponding to a higher order topological layer.

33. The computer system of claim 29 wherein the distances in the verification order between the positions corresponding to the child design cells and the positions corresponding to the respective parent design cells provide a lower probability of data dependencies between subsequently ordered design cells compared to the hierarchical organization.

34. The computer system of claim 29 wherein executing the instructions further causes the processors to:
- provide the plurality of design cells for verification according to the verification order, multiple design cells having no data dependencies to be verified in parallel.

35. The computer system of claim 34 wherein to provide the plurality of design cells, the processors are to:
- dispatch a first m design cells in the verification order to a verification queue, n design cells that have no data dependencies to be selected, verified, and dequeued from the queue in parallel; and
- iteratively dispatch a next m-n design cells in the verification order as design cells are selected, verified, and dequeued until a last design cells has been dispatched.

36. The computer system of claim 34 wherein to provide the plurality of design cells, the processors are to:
- examine the plurality of design cells in the verification order for data dependencies;
- dispatch for verification a first design cell determined to have no data dependencies;
- remove the dispatched design cell from further examination; and
- repeatedly examine remaining ones of the plurality of design cells in the verification order for data dependencies, dispatch for verification a first design cell among the remain ones to have no data dependencies, and remove the dispatched design cells until a last design cell is dispatched.

37. The computer system of claim 34 wherein to provide the plurality of design cells, the processors are to:
- select up to n design cells having no data dependencies in the verification order;
- dispatch the up to n design cells;
- wait for the up to n design cells to be verified in parallel; and
- repeatedly select, dispatch, and wait until a last design cell is dispatched.

* * * * *

UNITED STATES PATENT AND TRADEMARK OFFICE
CERTIFICATE OF CORRECTION

PATENT NO.      : 6,397,372 B1
DATED           : May 28, 2002
INVENTOR(S)     : Zeki Bozkus and Laurence W. Grodd It is certified that error appears in the above-identified patent and that said Letters Patent is hereby corrected as shown below:

Drawings,
Figure 4A, Reference no. 402, "CREATE PARALLEL VERIFICATION THREADS" should read -- CREATE N PARALLEL VERIFICATION THREADS --.

Column 4,
Lines 18 and 23, "moved pass a" should read -- moved past a --.
Line 25, "moved pass its" should read -- moved past its --.
Line 28, "the list." should read -- the list.) --.
Line 42, "by dipsatcher 106" should read -- by dispatcher 106 --.
Line 50, "of the processor." should read -- of the processors. --.
Line 54, "Windows NT" should read -- Windows NT® --.
Line 56, "UNIX" should read -- UNIX ® --.

Column 5,
Line 30, "queue or wait until" should read -- queue or waits until --.

Column 6,
Line 52, "constituent deign cells" should read -- constituent design cells --.

Column 8,
Line 55, "among the remain ones" should read -- among the remaining ones --.
Line 58, "claim 8 herein" should read -- claim 8 wherein --.

Column 10,
Line 38, "among the remain ones" should read -- among the remaining ones --.

Signed and Sealed this

Thirty-first Day of December, 2002

JAMES E. ROGAN
*Director of the United States Patent and Trademark Office*